US006533894B2

(12) United States Patent
Sharan et al.

(10) Patent No.: US 6,533,894 B2
(45) Date of Patent: Mar. 18, 2003

(54) RF POWERED PLASMA ENHANCED CHEMICAL VAPOR DEPOSITION REACTOR AND METHODS OF EFFECTING PLASMA ENHANCED CHEMICAL VAPOR DEPOSITION

(75) Inventors: Sujit Sharan, Boise, ID (US); Gurtej S. Sandhu, Boise, ID (US); Paul Smith, San Jose, CA (US); Mei Chang, Saratoga, CA (US)

(73) Assignees: Micron Technology, Inc., Boise, ID (US); Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/043,544

(22) Filed: Jan. 10, 2002

(65) Prior Publication Data

US 2002/0056416 A1 May 16, 2002

Related U.S. Application Data

(63) Continuation of application No. 09/026,042, filed on Feb. 19, 1998, now Pat. No. 6,395,128.

(51) Int. Cl.[7] .................................................. C23F 1/00
(52) U.S. Cl. ................................................. 156/345.47
(58) Field of Search ....................... 156/345.47, 345.34, 156/345.51, 345.43, 345.48; 118/723 E, 723 I, 728; 204/298.33; 216/71

(56) References Cited

U.S. PATENT DOCUMENTS

| | | |
|---|---|---|
| 4,585,516 A | 4/1986 | Corn et al. |
| 5,039,388 A | 8/1991 | Miyashita et al. |
| 5,052,339 A | 10/1991 | Vakerlis et al. |
| 5,102,523 A | 4/1992 | Beisswenger et al. |
| 5,147,493 A | 9/1992 | Nishimura et al. |
| 5,230,931 A | 7/1993 | Yamazaki et al. |
| 5,260,236 A | 11/1993 | Petro et al. |
| 5,261,962 A | 11/1993 | Hamamoto et al. |

(List continued on next page.)

FOREIGN PATENT DOCUMENTS

| | | |
|---|---|---|
| EP | 0 552 491 A1 | of 1993 |
| EP | 0 641 150 A1 | of 1995 |
| EP | 0 678 903 A1 | of 1995 |

(List continued on next page.)

OTHER PUBLICATIONS

Radio Frequency Matching for Helicon Plasma Sources, J.P. Rayner et al., J. Vac. Sci. Technol. A 14(4) Jul./Aug. 1996, pp. 2048–2055.

*Primary Examiner*—Gregory Mills
*Assistant Examiner*—P. Hassanzadeh
(74) *Attorney, Agent, or Firm*—Wells St. John P.S.

(57) ABSTRACT

Plasma enhanced chemical vapor deposition (PECVD) reactors and methods of effecting the same are described. In accordance with a preferred implementation, a reaction chamber includes first and second electrodes operably associated therewith. A single RF power generator is connected to an RF power splitter which splits the RF power and applies the split power to both the first and second electrodes. Preferably, power which is applied to both electrodes is in accordance with a power ratio as between electrodes which is other than a 1:1 ratio. In accordance with one preferred aspect, the reaction chamber comprises part of a parallel plate PECVD system. In accordance with another preferred aspect, the reaction chamber comprises part of an inductive coil PECVD system. The power ratio is preferably adjustable and can be varied. One manner of effecting a power ratio adjustment is to vary respective electrode surface areas. Another manner of effecting the adjustment is to provide a power splitter which enables the output power thereof to be varied. PECVD processing methods are described as well.

25 Claims, 4 Drawing Sheets

U.S. PATENT DOCUMENTS

| | | |
|---|---|---|
| 5,272,417 A | 12/1993 | Ohmi |
| 5,433,786 A | 7/1995 | Hu et al. |
| 5,439,524 A | 8/1995 | Cain et al. |
| 5,468,296 A | 11/1995 | Patrick et al. |
| 5,567,267 A | 10/1996 | Kazama et al. |
| 5,605,637 A | 2/1997 | Shan et al. |
| 5,607,542 A | 3/1997 | Wu et al. |
| 5,656,123 A | 8/1997 | Salimian et al. |
| 5,665,167 A | 9/1997 | Deguchi et al. |
| 5,716,534 A | 2/1998 | Tsuchiya et al. |
| 5,853,484 A | 12/1998 | Jeong |
| 5,863,339 A | 1/1999 | Usami |
| 5,865,937 A | 2/1999 | Shan et al. |
| 5,900,103 A | 5/1999 | Tomoyasu et al. |
| 5,919,332 A | 7/1999 | Koshiishi et al. |
| 5,942,075 A | 8/1999 | Nagahata et al. |
| 6,159,867 A | 12/2000 | Sharan et al. |

FOREIGN PATENT DOCUMENTS

| | | |
|---|---|---|
| EP | 0 686 708 A1 | of 1995 |
| EP | 742 577 A2 | of 1996 |
| EP | 776 991 A1 | of 1997 |
| EP | 831 679 A1 | of 1998 |
| FR | 2 663 806 | of 1991 |
| JP | 63-193527 | 10/1988 |
| JP | 5-175163 | 8/1993 |
| JP | 08-031806 | 2/1996 |
| WO | WO 89/02695 | 3/1989 |
| WO | WO 95/32315 | of 1995 |
| WO | WO 98/32154 | of 1998 |

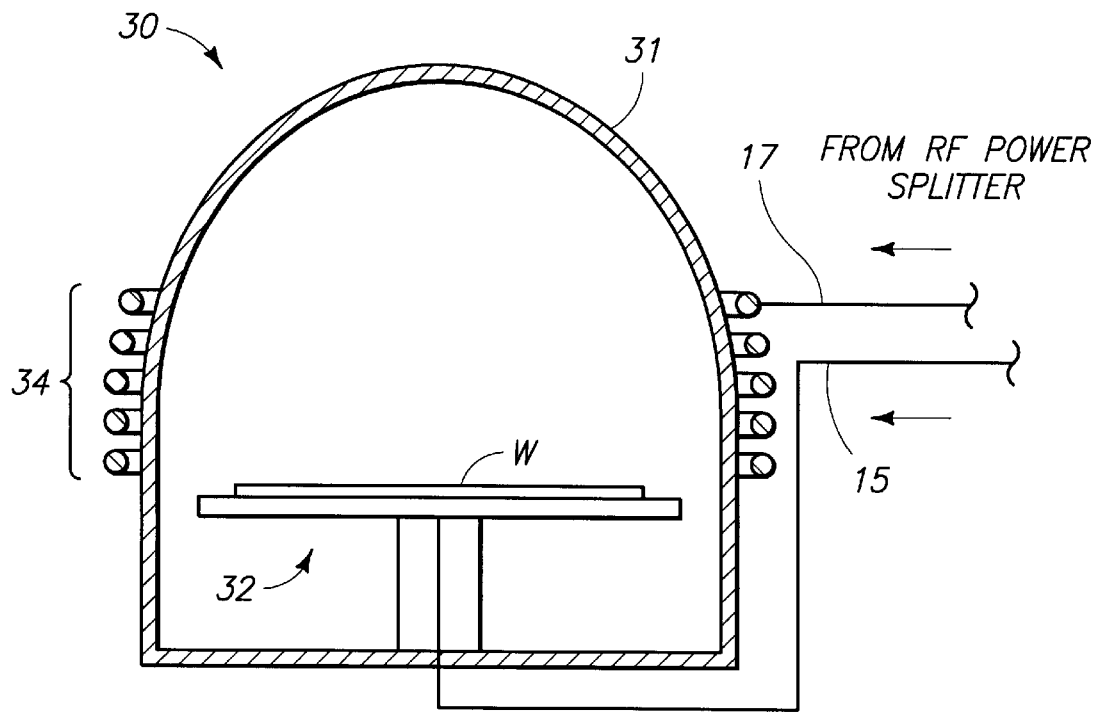
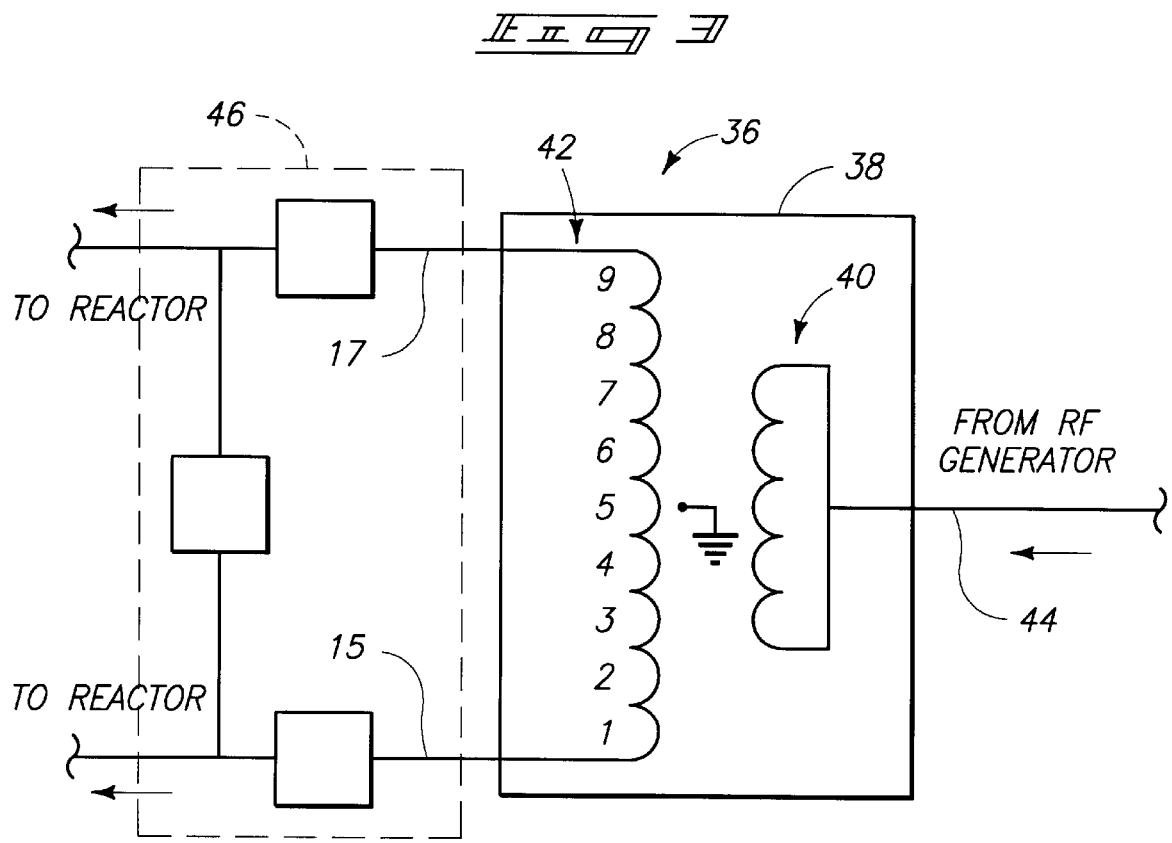

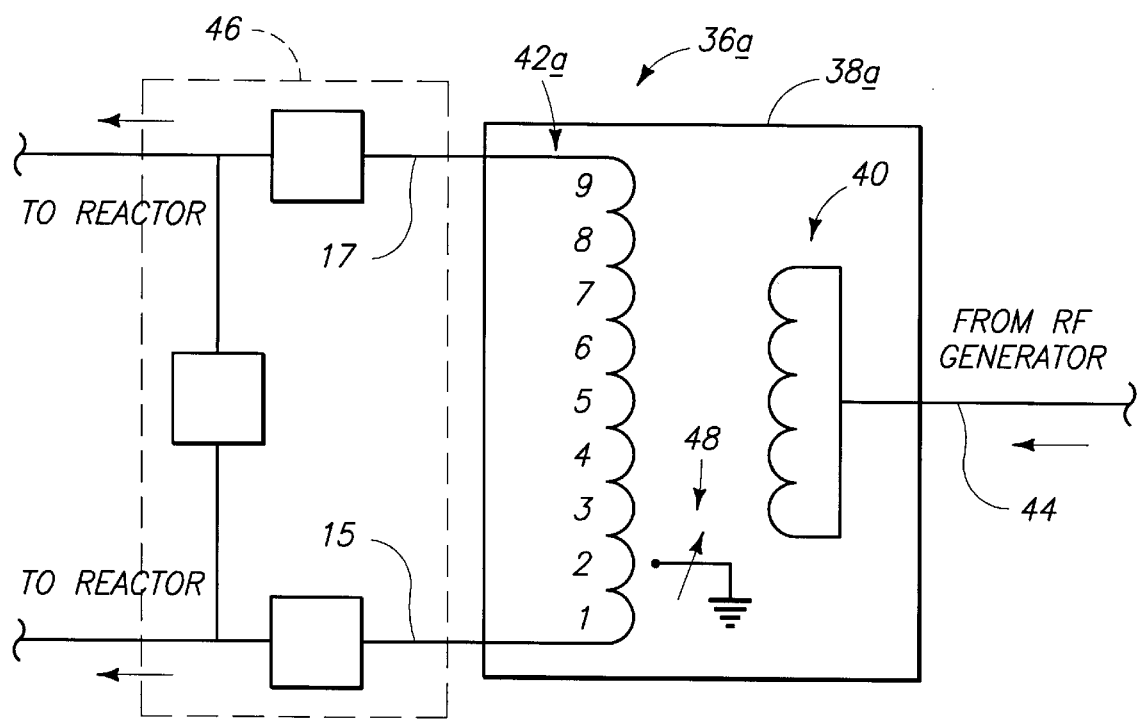

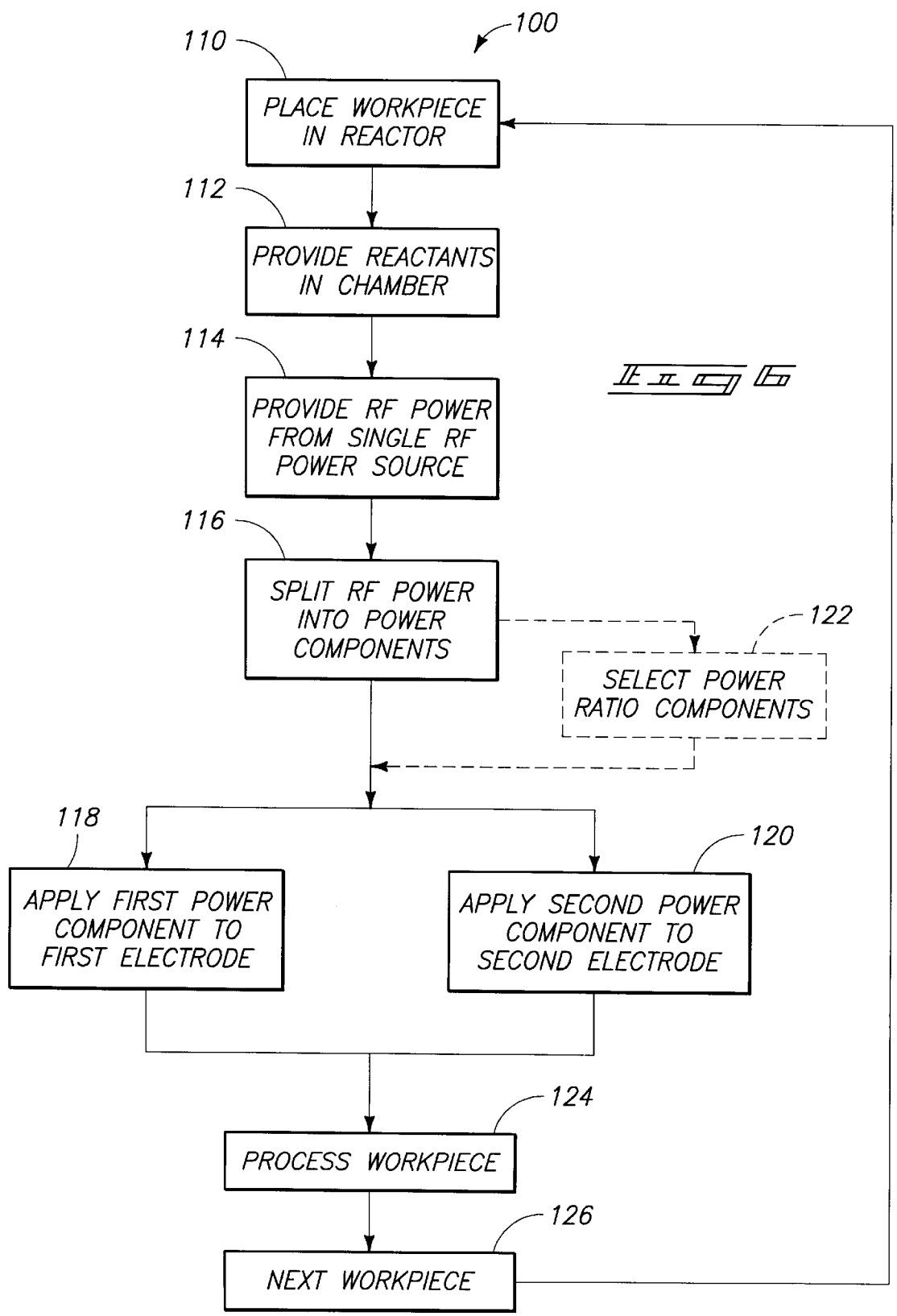

RF POWERED PLASMA ENHANCED CHEMICAL VAPOR DEPOSITION REACTOR AND METHODS OF EFFECTING PLASMA ENHANCED CHEMICAL VAPOR DEPOSITION

CROSS REFERENCE TO RELATED APPLICATION

This patent application is a Continuation Application of U.S. patent application Ser. No. 09/026,042, filed Feb. 19, 1998, now U.S. Pat. No. 6,395,128 entitled "RF Powered Plasma Enhanced Chemical Vapor Deposition Reactor and Methods of Effecting Plasma Enhanced Chemical Vapor Deposition," naming Sujit Sharan, Gurtej S. Sandhu, Paul Smith and Mei Chang as inventors, the disclosure of which is incorporated by reference. This application is related to U.S. Pat. No. 6,159,867, filed Aug. 19, 1999, which is a divisional application of U.S. Pat. No. 6,112,697, filed Feb. 19, 1998.

TECHNICAL FIELD

This invention relates to RF powered plasma enhanced chemical vapor deposition reactors and methods of effecting plasma enhanced chemical vapor deposition.

BACKGROUND OF THE INVENTION

Semiconductor processing often involves the deposition of films or layers over or on a semiconductor substrate surface which may or may not have other layers already formed thereon. One manner of effecting the deposition of such films or layers is through chemical vapor deposition (CVD). CVD involves a chemical reaction of vapor phase chemicals or reactants that contain the desired constituents to be deposited on the substrate or substrate surface. Reactant gases are introduced into a reaction chamber or reactor and are decomposed and reacted at a heated surface to form the desired film or layer.

There are three major CVD processes which exist and which may be utilized to form the desired films or layers. These are: atmospheric pressure CVD (APCVD), low pressure CVD (LPCVD), and plasma enhanced CVD (PECVD). The former two processes (APCVD and LPCVD) are characterized by their pressure regimes and typically use thermal energy as the energy input to effect desired chemical reactions. The latter process (PECVD) is characterized by its pressure regime and the method of energy input.

In PECVD systems, rather than relying on thermal energy to initiate and sustain chemical reactions, RF-induced glow discharge is used to transfer energy to the reactant gases. Such allows the substrate to remain at a lower temperature than the APCVD and LPCVD systems. Lower substrate temperatures are desirable in some instances because some substrates do not have the thermal stability to accept coating by the other methods. Other desirable characteristics include that deposition rates can be enhanced and films or layers with unique compositions and properties can be produced. Furthermore, PECVD processes and systems provide other advantages such as good adhesion, low pinhole density, good step coverage, adequate electrical properties, and compatibility with fine-line pattern transfer processes.

One problem, however, associated with deposition processing including PECVD processing stems from non-uniform film or layer coverage which can result especially in high aspect ratio topographies. For example, a problem known as "bread-loafing" or cusping can typically occur in deposition processing. Such normally involves undesirable non-uniform build-up of deposited material forming what appear as key hole spaces between features on a substrate. One prior art solution has been to conduct multiple depositions of very thin layers with intervening plasma etching treatments. The intervening plasma etching serves to remove or cut away the cusps to form a more uniformly applied layer. Thereafter, repeated depositions and etchings are conducted until the desired coverage is achieved. It is desirable to improve upon the quality of film or layer deposition in PECVD processes and reactors.

This invention grew out of concerns associated with improving PECVD processing systems and methods. This invention also grew out of concerns associated with improving the advantages and characteristics associated with PECVD systems, including those advantages and characteristics mentioned above.

SUMMARY OF THE INVENTION

Plasma enhanced chemical vapor deposition (PECVD) reactors and methods of effecting the same are described. In accordance with a preferred implementation, a reaction chamber includes first and second electrodes operably associated therewith. A single RF power generator is connected to an RF power splitter which splits the RF power and applies the split power to both the first and second electrodes. Preferably, power which is applied to both electrodes is in accordance with a power ratio as between electrodes which is other than a 1:1 ratio. In accordance with one preferred aspect, the reaction chamber comprises part of a parallel plate PECVD system. In accordance with another preferred aspect, the reaction chamber comprises part of an inductive coil PECVD system. The power ratio is preferably adjustable and can be varied. One manner of effecting a power ratio adjustment is to vary respective electrode surface areas. Another manner of effecting the adjustment is to provide a power splitter which enables the output power thereof to be varied. PECVD processing methods are described as well.

BRIEF DESCRIPTION OF THE DRAWINGS

Preferred embodiments of the invention are described below with reference to the following accompanying drawings.

FIG. 3 shows another implementation of another preferred PECVD reactor for use in the FIG. 1 system.

FIG. 4 shows one implementation of one preferred power splitter for use in the FIG. 1 system.

FIG. 5 shows another implementation of another preferred power splitter for use in the FIG. 1 system.

FIG. 6 is a flow chart illustrating preferred processing methods for use in connection with the preferred embodiments of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
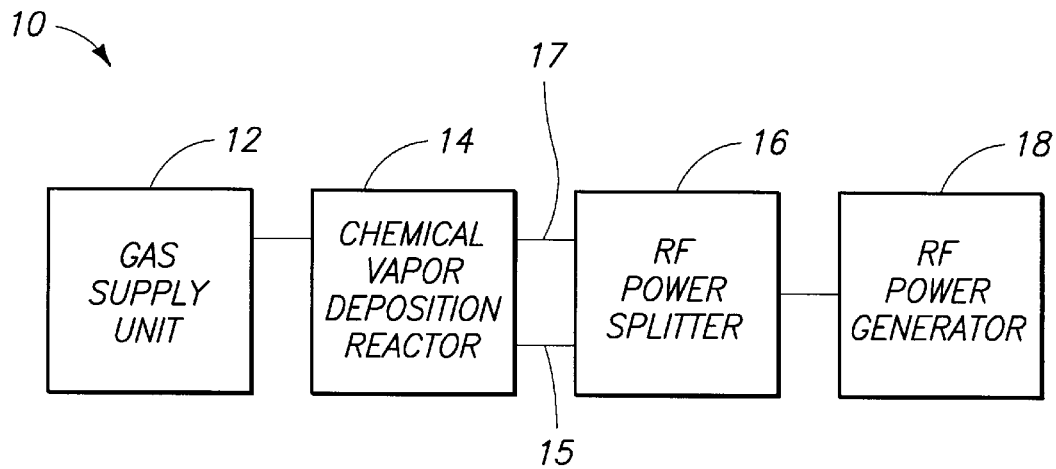
FIG. 1 is a block diagram of a plasma enhanced chemical vapor deposition (PECVD) reactor system in accordance with preferred embodiments of the present invention.

Referring to FIG. 1, a plasma enhanced chemical vapor deposition (PECVD) reactor system is shown in block diagram form generally at 10. System 10 includes a gas supply unit 12, a chemical vapor deposition reactor 14, an RF power splitter 16 and an RF power generator 18.

Gas supply unit 12 can supply one or more gaseous reactants into reactor 14 for processing in accordance with the invention. Typically, such systems use an RF-induced glow discharge to transfer energy into the reactant gases. Subsequently, free electrons are created within the discharge region which gain energy so that when they collide with gas molecules, gas-phase dissociation and ionization of the reactant gases occurs. Accordingly, energetic species are then absorbed on a workpiece or substrate.

PECVD reactor 14 defines a processing chamber or volume interiorly of which processing takes place in accordance with the invention. In a first preferred implementation, reactor 14 comprises a parallel plate reactor. Such parallel plate reactor can be configured to process only one semiconductor workpiece or wafer. Alternately, such reactor can be configured to process more than one semiconductor workpiece or wafer. In a second preferred implementation, reactor 14 comprises an inductive coil PECVD reactor. Both preferred implementations are discussed below in more detail in connection with FIGS. 2 and 3.

Referring still to FIG. 1, RF power splitter 16 in the illustrated and preferred embodiments splits or otherwise divides RF input power which is provided by RF power generator 18 into RF power components which are thereafter used to power separate reactor electrodes. In a preferred implementation, such power is split or divided in accordance with a selected power ratio which can be manipulated by an operator of the system. Preferably, such ratio is one which is other than a direct 1:1 ratio. Such split or divided power is subsequently applied via lines or terminals 15, 17 to individual electrodes comprising a part of reactor 14, as will be described below.

Figure 2:
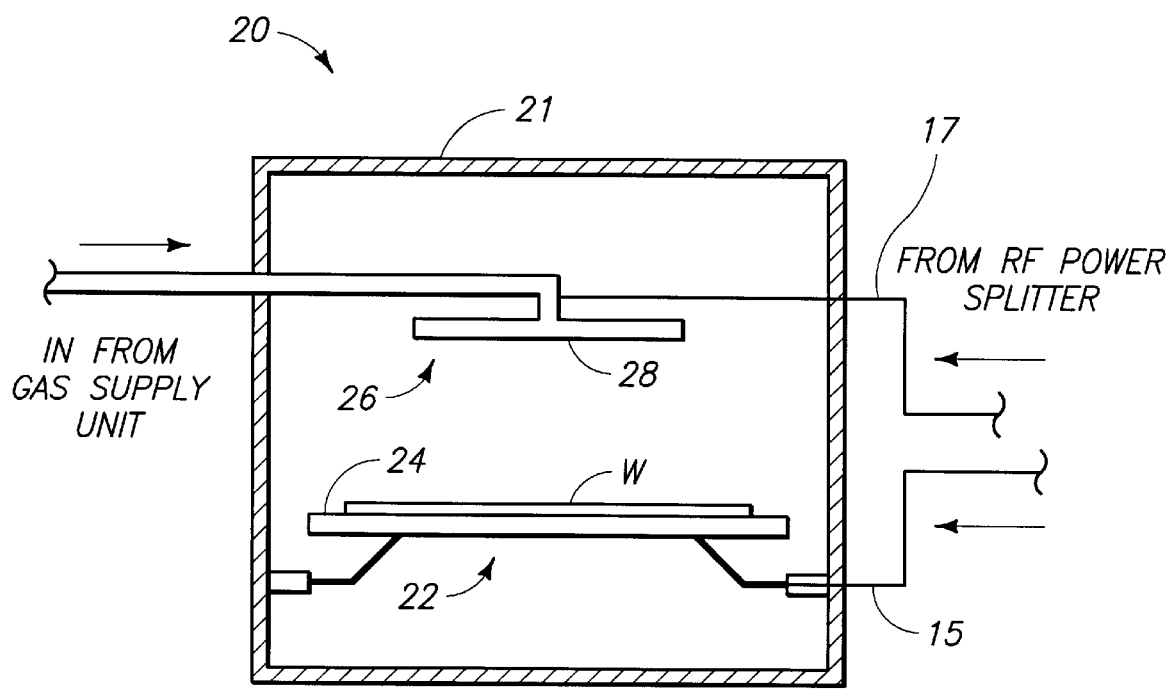
FIG. 2 shows one implementation of one preferred PECVD reactor for use in the FIG. 1 system.

Referring to FIG. 2, a PECVD reactor according to a first preferred implementation is set forth generally at 20. Reactor 20 preferably comprises a capacitive parallel plate reactor which may or may not be configured to process more than one workpiece or wafer. Preferably, reactor 20 defines a processing chamber 21 which includes a first electrode 22 disposed internally thereof. Electrode 22 is configured for supporting at least one semiconductor workpiece in the form of semiconductor wafer W. The term "supporting" as such is used in this document and in connection with the first electrode in each of the embodiments is intended to mean holding or positioning one or more semiconductor workpieces in a desired orientation so that chemical vapor deposition can take place. Accordingly, semiconductor workpieces can be supported, held or otherwise positioned in orientations other than the shown horizontal position. Moreover, although the invention is discussed in the context of a system which includes only two electrodes, it is to be understood that the invented reactors and methods can find use in systems which are not necessarily limited to only two electrodes. First electrode 22 includes a first electrode surface area 24 upon which wafer W rests for processing in accordance with the invention. First electrode 22, in the illustrated and preferred embodiment, is a susceptor which supports the workpiece. Processing chamber 21 includes a second electrode 26 which is disposed internally thereof. A gap exists between the electrodes such that the electrodes are suitably spaced from one another. In the illustrated and preferred embodiment, second electrode 26 constitutes a shower head electrode which is positioned operably adjacent the susceptor and configured to provide gaseous reactants into the chamber from gas supply unit 12 (FIG. 1). Gaseous reactants can, however, be introduced into the reactor in other ways. Preferably, second electrode 26 defines a second electrode surface area 28 which is different from and preferably smaller than first electrode surface area 24. That is, first electrode surface area 24 is larger than the second electrode surface area 28. Such surface area differential between the first and second electrodes enables an RF power differential to be developed as between the electrodes using only a single RF power source. Such will become apparent from the discussion below.

Referring still to FIG. 2, lines 15 and 17 are respectively operably connected to first and second electrodes 22, 26. Such lines connect RF power generator 18 (FIG. 1) to the respective electrodes through RF power splitter 16 which, for the purpose of the ongoing discussion, is operatively interposed between the RF power generator and both the susceptor and the shower head electrodes. Preferably, RF power generator 18 comprises a single generator power source which is operatively associated with the processing chamber and configured to provide RF power to the RF power splitter which, in turn, provides RF power to both the susceptor and the shower head according to a selected power ratio which is discussed below in more detail. Such represents a novel departure from prior PECVD reactors wherein only the shower head electrode was powered by an RF power source with the susceptor electrode being grounded. The illustrated single RF power generator is preferably configured to provide RF power to the electrodes which is effective to both develop a plasma processing environment within the processing chamber and provide a desired bias relative to the semiconductor workpiece. For example, maintaining the electrodes at the preferred power differential facilitates acceleration of ions or ionic species toward the subject workpiece or wafer which enhances conformal coverage, particularly in high aspect ratio topographies. Furthermore, greater uniformity in film or layer composition, as well as greater film or layer purity levels are possible.

Referring to FIG. 3, and in accordance with another preferred implementation of the invention, a different type of PECVD reactor 30 is set forth. Such reactor comprises an inductive coil PECVD reactor. Reactor 30 comprises a processing chamber 31 interiorly of which chemical vapor deposition processing can take place in accordance with the invention. A first electrode 32 is disposed internally of the reactor and is configured for supporting at least one semiconductor workpiece, such as wafer W thereon. First electrode 32 is powered by the preferred single RF power generator 18 (FIG. 1). It is possible for more than one wafer to be processed in accordance with the invention. A second electrode 34 is provided externally of processing chamber 31 and comprises a plurality of coils which are powered by the same preferred single RF power generator.

Referring to both FIGS. 2 and 3, such comprise PECVD reactors which include respective electrodes both of which are powered by a single RF power generator or supply. According to a first implementation, both electrodes are disposed internally of the processing chamber (FIG. 2). According to second preferred implementation, at least one of the electrodes is disposed externally of the processing chamber (FIG. 3). Both electrodes in both preferred implementations are powered from and by a single RF powered generator, such as generator 18 in FIG. 1. As mentioned above, this represents a novel departure from previous PECVD reactors where both electrodes were not powered with RF power from a common, single RF power source.

Referring to FIG. 4, a preferred RF power splitter is set forth generally at 36. Power splitter 36 in the illustrated and preferred embodiment comprises a transformer 38 which includes an input side or primary windings 40 and an output side or secondary windings 42. Input side 40 is operatively coupled or connected to RF power generator 18 (FIG. 1) via a coaxial cable 44 and receives power generated thereby. Output side 42 includes at least two output terminals 15, 17 which are operatively coupled or connected to respective first and second electrodes 22, 26 (in the FIG. 2 PECVD reactor) or first and second electrodes 32, 34 (in the FIG. 3 PECVD reactor). In a preferred implementation, the output side has no more than two terminals, and the first and second electrodes constitute the only processing chamber electrodes which are powered thereby. Power splitter 36 splits input power provided by power generator 18 into first and second power components which are thereafter provided to the respective electrodes. The output side of the preferred transformer provides power to each of the first and second electrodes in accordance with a selected power ratio which is discussed below. A suitable matching network 46 is provided for impedance matching purposes. Such networks typically include various capacitative and inductive components which are configured for impedance matching. Such are represented in block diagram form in box 46.

In accordance with a preferred aspect of the invention, RF power splitter 36 comprises a center tapped transformer in which the output power provided to the respective first and second electrodes is substantially equal in magnitude. Such is desirable when power splitter 36 is used in connection with the PECVD reactor of FIG. 2. In such circumstances, it has been found that the ratio of power which is applied to the electrodes is related to surface areas 24, 28 of electrodes 22, 26. Hence, by changing or manipulating the subject surface areas, one can manipulate or select the power ratio and affect the magnitudes of the first and second power components which are "seen" by the respective electrodes to which such power components are applied. In the illustrated and preferred embodiment, such surface areas are different from one another, with the susceptor surface area being larger than the shower head surface area. Such enables a power differential to be developed according to a definable relationship. Such relationship consists of a predefined relative magnitude which is directly proportional to the inverse ratio of the 4th power of the areas of the electrodes. Put another way, by varying the relative surface area ratios as between the susceptor and shower head, a variation in power applied thereto can be effectuated. In the illustrated and preferred embodiment, second electrode or shower head 26 has a surface area which is less than or smaller than the surface area of the first electrode or susceptor 22. Such results in a higher magnitude of power being applied to the shower head than is applied to the susceptor. This advantageously allows deposition of reactants introduced into chamber 21 in a preferred manner by causing highly energetic species to be drawn toward and in the direction of the electrode supporting the workpiece.

Referring to FIG. 5, an alternate preferred power splitter is set forth generally at 36a. Such alternate preferred power splitter enables the desired power differential to be developed without regard to and independently of the surface area ratios between the subject electrodes, whether such electrodes be those associated with the FIG. 2 reactor or the FIG. 3 reactor. Like numbers from the first described power splitter are utilized where appropriate, with differences being indicated with the suffix "a" or with different numerals. Accordingly, power splitter 36a comprises an input side 40 which is operatively coupled with RF generator 18 (FIG. 1) and an output side 42a which is operatively coupled with one of the preferred reactors 20, 30. Such enables, but does not require reactor 20 of FIG. 2 to have a susceptor electrode and a shower head electrode with respective surface areas which are more nearly equal. Power splitter 36a advantageously allows the selected power ratio to be adjusted in a manner which varies the power supplied to the electrodes. Accordingly, and in the illustrated and preferred embodiment, the RF power splitter comprises a transformer having a plurality of secondary windings 42a. Such are desirably variably groundable as is indicated at 48.

Referring still to FIG. 5 and for illustrative purposes only, output side 42a is shown as comprising nine windings. By selectively grounding different windings or coils, different ratios of power are provided to the shower head and susceptor electrodes. More specifically for example, if the number 2 coil or winding is grounded as shown, then the first electrode, either electrode 22 (FIG. 2) or 32 (FIG. 3) receives two ninths (2/9) or 22.2% of the input power from the power generator. Accordingly, the second electrode, either electrode 26 (FIG. 2) or 34 (FIG. 3) receives seven ninths (7/9) or 77.8% of the input power. Relatedly, if the number 7 coil or winding is grounded, the distribution of power is reversed, i.e. the first electrode receives seven ninths (7/9) of the input power and the second electrode receives two ninths (2/9) of the input power. As such, the provision of power to the preferred electrodes can be varied to accommodate different processing regimes. In the illustrated and preferred FIG. 5 embodiment, power splitter 36a is able to be adjusted by an end user for varying the selected power ratio to accommodate different processing regimes. Such processing regimes preferably provide a greater quanta of power to the second electrode rather than the first electrode. Alternately, the power provided to the electrode which is closest in proximity to the semiconductor workpiece is less than the power provided to the electrode which is spaced apart from such workpiece.

Accordingly, two separate and preferred power splitters have been described. The first of which (FIG. 4) is advantageous for producing output power having magnitudes which are substantially the same. Such power splitter is suited for use in reactors, such as reactor 20 of FIG. 2 in which the ultimate magnitude of power supplied to the illustrated electrodes can be adjusted by varying the surface area ratios of the subject electrodes. Such power splitter may also be used in connection with reactor 30. Alternately, and equally as preferred, a power splitter 36a (FIG. 5) allows for the output power to be variably adjusted to a selected power ratio which is suitable for use in reactors, such as reactor 20 of FIG. 2, in which electrodes do not have or are not required to have a meaningful variance between the electrode surface areas. Additionally, such power splitter can be and preferably is utilized in connection with reactor 30 of FIG. 3.

Referring to FIG. 6, a representative flow chart of a preferred method of processing semiconductor workpieces in connection with the above described reactors is set forth generally at 100. The preferred methodology involves first at step 110 placing a semiconductor workpiece in a selected one of the above-described PECVD reactors. According to a preferred implementation, a susceptor is provided for supporting the workpiece internally of the processing chamber. In accordance with the FIG. 2 embodiment, a shower head electrode 26 is provided operably adjacent the susceptor and is configured for providing gaseous reactants into chamber. According to the FIG. 3 embodiment, at least one of the reactor electrodes is disposed externally of the chamber. At step 112, gaseous reactants are provided into the reactor chamber whereupon, at step 114, RF power from the preferred single or common RF power source is provided. At step 116, the provided RF power is split into first and second power components which are selectively provided to the respective electrodes discussed above. For example, a first power component at step 118 is applied to a first of the electrodes. At step 120, a second of the power components is applied to a second of the electrodes. Preferably, the applied power components are different from one another with such difference stemming from either a variation in electrode surface areas (FIG. 2) or a variably selectable grounding of the secondary or output side 42a (FIG. 5) of power splitter 36a. According to a preferred implementation, a transformer output coil, other than the center coil, can be selectively grounded for varying the relative magnitudes of the power components. Such is indicated as an optional step 122 wherein an individual user may select a desired power ratio as between reactor electrodes. At processing step 124, and with the desired power ratio being applied to the selected electrodes, the semiconductor workpiece is processed to effect chemical vapor deposition thereupon. At step 126, processing is complete and a next workpiece may be processed in accordance with the above description.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A capacitive plasma enhanced chemical vapor deposition reactor comprising:
    a susceptor electrode configured to support at least one semiconductor workpiece, the susceptor electrode comprising a first surface area $A_1$;
    a shower head electrode operably adjacent the susceptor electrode and configured to provide gaseous reactants, the shower head electrode comprising a second surface area $A_2$ which is less than the first surface area $A_1$;
    a single RF power generator operatively coupled with the susceptor electrode and the shower head electrode and configured to provide RF power thereto effective to develop a plasma processing environment and a desired bias relative to the semiconductor workpiece; and
    an RF power splitter comprising a transformer having a primary winding and a separate secondary winding, the primary winding coupled to the RF power generator and the secondary winding coupled to both the susceptor electrode and the shower head electrode, the RF power splitter configured to provide power from the RF power generator to both the susceptor and the shower head electrode at a selected power ratio between the susceptor electrode and the shower head electrode, wherein the selected power ratio is a function of an inverse of a surface area ratio $A_1/A_2$.

2. The plasma enhanced chemical vapor deposition reactor of claim 1, wherein the selected power ratio is other than a 1:1 ratio.

3. The plasma enhanced chemical vapor deposition reactor of claim 1, wherein the RF power splitter comprises a transformer including a center tapped secondary winding having at least two output terminals, individual output terminals being connected to a respective one of the susceptor electrode and the shower head electrode.

4. The plasma enhanced chemical vapor deposition reactor of claim 1, wherein the selected power ratio is adjustable.

5. The plasma enhanced chemical vapor deposition reactor of claim 1, wherein the RF power splitter comprises a transformer having a plurality of variably groundable secondary windings for changing the selected power ratio.

6. The plasma enhanced chemical vapor deposition reactor of claim 1, wherein he RF power splitter comprises a plurality of variably groundable secondary windings for adjusting the selected power ratio.

7. A capacitive plasma enhanced chemical vapor deposition reactor comprising:
    a processing chamber;
    a susceptor electrode within the chamber configured to support at least one semiconductor workpiece, the susceptor electrode comprising a first surface area $A_1$;
    a shower head electrode within the chamber operably adjacent the susceptor electrode and configured to provide gaseous reactants into the chamber, the shower head electrode comprising a second surface area $A_2$ which is less than the first surface area $A_1$;
    a single RF power generator operatively coupled with the susceptor electrode and the shower head electrode and configured to provide RF power thereto effective to develop a plasma processing environment within the chamber and a desired bias relative to the semiconductor workpiece; and
    an RF power splitter comprising a transformer having a primary winding and a separate secondary winding, the primary winding coupled to the RF power generator and the secondary winding coupled to both the susceptor electrode and the shower head electrode, the RF power splitter configured to provide power from the RF power generator to both the susceptor and the shower head electrode at a selected power ratio between the susceptor electrode and the shower head electrode, wherein the selected power ratio is a function of a surface area ratio $A_1/A_2$, wherein;
    the RF power splitter comprises a transformer including a center tapped secondary winding; and
    the selected power ratio applies RF power to the showerhead electrode proportional to $(A_1/A_2)^4$.

8. A parallel plate plasma enhanced chemical vapor deposition reactor comprising:
    a susceptor electrode configured to support at least one semiconductor workpiece, the susceptor electrode comprising a first surface area $A_1$;
    a shower head electrode configured to provide reactants, the shower head electrode comprising a second surface area $A_2$ which is less than the first surface area $A_1$; and
    a single RF power source operatively coupled to both the shower head electrode and the susceptor electrode and configured to provide RF power to each electrode proportional to an inverse ratio of areas of the shower head and susceptor electrode and effective to develop a desired bias relative to a semiconductor workpiece supported by the susceptor electrode and to develop a plasma processing environment.

9. A parallel plate plasma enhanced chemical vapor deposition reactor comprising:
    a processing chamber;
    a susceptor electrode in the chamber and configured to support at least one semiconductor workpiece, the susceptor electrode comprising a first surface area $A_1$;

a shower head electrode in the chamber and configured to provide reactants into the chamber, the shower head electrode comprising a second surface area $A_2$ which is less than the first surface area $A_1$; and a single RF power source operatively coupled to both the shower head electrode and the susceptor electrode and configured to provide RF power to each electrode according to a predefined relative magnitude effective to develop a desired bias relative to a semiconductor workpiece supported by the susceptor electrode and to develop a plasma processing environment within the processing chamber, wherein the predefined relative magnitude is directly proportional to the inverse ratio of the 4th power of the areas of the electrodes.

10. A parallel plate plasma enhanced chemical vapor deposition reactor comprising:

a processing chamber;

a susceptor electrode in the chamber and configured to support at least one semiconductor workpiece, the susceptor electrode comprising a first surface area $A_1$;

a shower head electrode in the chamber and configured to provide reactants into the chamber, the shower head electrode comprising a second surface area $A_2$ which is less than the first surface area $A_1$; and a single RF power source operatively coupled to both the shower head electrode and the susceptor electrode and configured to provide RF power to each electrode according to a predefined relative magnitude effective to develop a desired bias relative to a semiconductor workpiece supported by the susceptor electrode and to develop a plasma processing environment within the processing chamber, wherein the single RF power source is configured to apply RF power to the showerhead electrode proportional to $(A_1/A_2)^4$.

11. A parallel plate plasma enhanced chemical vapor deposition reactor comprising:

a susceptor electrode configured to support at least one semiconductor workpiece, the susceptor electrode having a susceptor surface area $A_1$;

a shower head electrode operably adjacent the susceptor electrode and configured to provide gaseous reactants, the shower head electrode having a shower head surface area $A_2$ which is smaller than the susceptor electrode surface area $A_1$;

a single RF power generator operatively associated with the susceptor and showerhead electrodes and configured to provide RF power; and a transformer having an input side and a separate, tapped secondary having no more than two output terminals, the input side being operably connected with and capable of receiving RF power from the RF power generator, and individual respective output terminals being connected with the susceptor electrode and the shower head electrode and configured to provide RF power to each electrode at a selected power ratio which is a function of an inverse of a ratio of the areas of the electrodes.

12. A parallel plate plasma enhanced chemical vapor deposition reactor comprising;

a processing chamber;

a susceptor electrode within the chamber configured to support at least one semiconductor workpiece, the susceptor electrode having a susceptor surface area $A_1$;

a shower head electrode within the chamber operably adjacent the susceptor electrode and configured to provide gaseous reactants into the chamber, the shower head electrode having a shower head surface area $A_2$ which is smaller than the susceptor electrode surface area $A_1$;

a single RF power generator operatively associated with the processing chamber and configured to provide RF power; and a transformer having an input side and a separate, tapped secondary having no more than two output terminals, the input side being operably connected with and capable of receiving RF power from the RF power generator, and individual respective output terminals being connected with the susceptor electrode and the shower head electrode and configured to provide RF power to each electrode at a selected power ratio which is a function of a ratio of the areas of the electrodes wherein the transformer is configured to apply RF power to the showerhead electrode proportional to $(A_1/A_2)^4$.

13. A parallel plate plasma enhanced chemical vapor deposition reactor comprising:

a processing chamber;

a susceptor electrode within the chamber configured to support at least one semiconductor workpiece, the susceptor electrode having a susceptor surface area $A_1$;

a shower head electrode within the chamber operably adjacent the susceptor electrode and configured to provide gaseous reactants into the chamber, the shower head electrode having a shower head surface area $A_2$ which is smaller than the susceptor electrode surface area $A_1$;

a single RF power generator operatively associated with the processing chamber and configured to provide RF power; and a transformer having an input side and a separate, tapped secondary having no more than two output terminals, the input side being operably connected with and capable of receiving RF power from the RF power generator, and individual respective output terminals being connected with the susceptor electrode and the shower head electrode and configured to provide RF power to each electrode at a selected power ratio which is a function of a ratio of the areas of the electrodes wherein the transformer is configured to apply RF power to the showerhead electrode proportional to a power of a ratio $A_1/A_2$.

14. A plasma enhanced chemical vapor deposition reactor comprising:

a first electrode configured for supporting a workpiece, the first electrode having a first surface area $A_1$;

a second electrode operably associated with the first electrode, the second electrode having a second surface area $A_2$ that is less than the first surface area $A_1$;

a single RF power generator configured to provide RF power;

a transformer having an input side and an output side with only two output terminals which form individual connections with any of the reactor's electrodes, the input side being operably connected with and receiving power from the RF power generator, the output terminals being configured to provide RF power to each electrode at a selected power ratio which is effective to both (a) develop a desired bias relative to a workpiece, and (b) establish and maintain a plasma processing environment, the transformer being configured to provide RF power to each electrode at a selected power ratio which is a function of an inverse of a ratio $A_1/A_2$ of the areas of the electrodes; and the output side further comprising a plurality of windings, individual windings of which can be selectively grounded for varying the RF power provided to the respective electrodes and the selected power ratio thereof.

15. The plasma enhanced chemical vapor deposition reactor of claim 14, wherein the reactor is an inductive coil reactor.

16. The plasma reactor of claim 14, wherein at least one of the electrodes is configured for supporting a semiconductor workpiece.

17. A plasma enhanced chemical vapor deposition reactor comprising:

a processing chamber;

a first electrode inside the chamber and configured for supporting a workpiece, the first electrode having a first surface area $A_1$;

a second electrode operably associated with the chamber, the second electrode having a second surface area $A_2$ that is less than the first surface area $A_1$;

a single RF power generator configured to provide RF power;

a transformer having an input side and an output side with only two output terminals which form individual connections with any of the reactor's electrodes, the input side being operably connected with and receiving power from the RF power generator, the output terminals being configured to provide RF power to each electrode at a selected power ratio which is effective to both (a) develop a desired bias relative to a workpiece, and (b) establish and maintain a plasma processing environment inside the processing chamber, the transformer being configured to provide RF power to each electrode at a selected power ratio which is a function of a ratio $A_1/A_2$ of the areas of the electrodes; and the output side further comprising a plurality of windings, individual windings of which can be selectively grounded for varying the RF power provided to the respective electrodes and the selected power ratio thereof, wherein the selected power ratio is configured to apply RF power to the second electrode proportional to a power of $A_1/A_2$.

18. A plasma enhanced chemical vapor deposition reactor comprising:

a processing chamber;

a first electrode inside the chamber and configured for supporting a workpiece, the first electrode having a first surface area $A_1$;

a second electrode operably associated with the chamber, the second electrode having a second surface area $A_2$ that is less than the first surface area $A_1$;

a single RF power generator configured to provide RF power;

a transformer having an input side and an output side with only two output terminals which form individual connections with any of the reactor's electrodes, the input side being operably connected with and receiving power from the RF power generator, the output terminals being configured to provide RF power to each electrode at a selected power ratio which is effective to both (a) develop a desired bias relative to a workpiece, and (b) establish and maintain a plasma processing environment inside the processing chamber, the transformer being configured to provide RF power to each electrode at a selected power ratio which is a function of a ratio $A_1/A_2$ of the areas of the electrodes; and the output side further comprising a plurality of windings, individual windings of which can be selectively grounded for varying the RF power provided to the respective electrodes and the selected power ratio thereof, wherein the second electrode is a showerhead electrode disposed inside the chamber and the selected power ratio is configured to apply RF power to the showerhead electrode proportional to a power of $A_1/A_2$.

19. A plasma enhanced chemical vapor deposition reactor comprising:

a processing chamber;

a first electrode inside the chamber and configured for supporting a workpiece, the first electrode having a first surface area $A_1$;

a second electrode operably associated with the chamber, the second electrode having a second surface area $A_2$ that is less than the first surface area $A_1$;

a single RF power generator configured to provide RF power;

a transformer having an input side and an output side with only two output terminals which form individual connections with any of the reactor's electrodes, the input side being operably connected with and receiving power from the RF power generator, the output terminals being configured to provide RF power to each electrode at a selected power ratio which is effective to both (a) develop a desired bias relative to a workpiece, and (b) establish and maintain a plasma processing environment inside the processing chamber, the transformer being configured to provide RF power to each electrode at a selected power ratio which is a function of a ratio $A_1/A_2$ of the areas of the electrodes; and the output side further comprising a plurality of windings, individual windings of which can be selectively grounded for varying the RF power provided to the respective electrodes and the selected power ratio thereof, wherein the second electrode is a showerhead electrode disposed inside the chamber and wherein the selected power ratio is configured to apply RF power to the showerhead electrode proportional to $(A_1/A_2)^4$.

20. A capacitive plasma enhanced chemical vapor deposition reactor including:

a susceptor electrode within the reactor and configured to support at least one semiconductor workpiece;

a shower head electrode within the reactor operably adjacent the susceptor electrode and configured to provide gaseous reactants into the reactor, a surface area $A_2$ of the shower head electrode being less than a surface area $A_1$ of the susceptor electrode;

a single RF power generator operatively coupled with the susceptor electrode and the shower head electrode and configured to provide RF power thereto effective to develop a plasma processing environment within the reactor and a desired bias relative to the semiconductor workpiece; and an RF power splitter comprising a transformer having a primary winding and a separate secondary winding, the primary winding coupled to the RF power generator and the secondary winding coupled to both the susceptor electrode and the shower head electrode, the RF power splitter configured to provide power from the RF power generator to both the susceptor and the shower head electrode at a selected power ratio between the susceptor electrode and the shower head electrode, the selected power ratio being configured to supply a power component to the showerhead electrode that is a function of an inverse of a ratio $A_1/A_2$ of the areas.

21. The plasma enhanced chemical vapor deposition reactor of claim 20, wherein the RF power splitter comprises a transformer including a center tapped secondary winding having at least two output terminals, individual output terminals being connected to a respective one of the susceptor electrode and the shower head electrode.

22. The plasma enhanced chemical vapor deposition reactor of claim 20, wherein the selected power ratio is adjustable.

23. The plasma enhanced chemical vapor deposition reactor of claim 20, wherein the RF power splitter comprises a plurality of variably groundable secondary windings for adjusting the selected power ratio.

24. A capacitive plasma enhanced chemical vapor deposition reactor including:
- a susceptor electrode within the reactor and configured to support at least one semiconductor workpiece;
- a shower head electrode within the reactor operably adjacent the susceptor electrode and configured to provide gaseous reactants into the reactor, a surface area $A_2$ of the shower head electrode being less than a surface area $A_1$ of the susceptor electrode;
- a single RF power generator operatively coupled with the susceptor electrode and the shower head electrode and configured to provide RF power thereto effective to develop a plasma processing environment within the reactor and a desired bias relative to the semiconductor workpiece; and
- an RF power splitter comprising a transformer having a primary winding and a separate secondary winding, the primary winding coupled to the RF power generator and the secondary winding coupled to both the susceptor electrode and the shower head electrode, the RF power splitter configured to provide power from the RF power generator to both the susceptor and the shower head electrode at a selected power ratio between the susceptor electrode and the shower head electrode, the selected power ratio being configured to supply a power component to the showerhead electrode that is a function of a ratio $A_1/A_2$ of the areas, wherein the selected power ratio is configured to apply RF power to the showerhead electrode proportional to a power of the ratio $A_1/A_2$.

25. A capacitive plasma enhanced chemical vapor deposition reactor including:
- a susceptor electrode within the reactor and configured to support at least one semiconductor workpiece;
- a shower head electrode within the reactor operably adjacent the susceptor electrode and configured to provide gaseous reactants into the reactor, a surface area $A_2$ of the shower head electrode being less than a surface area $A_1$ of the susceptor electrode;
- a single RF power generator operatively coupled with the susceptor electrode and the shower head electrode and configured to provide RF power thereto effective to develop a plasma processing environment within the reactor and a desired bias relative to the semiconductor workpiece; and
- an RF power splitter comprising a transformer having a primary winding and a separate secondary winding, the primary winding coupled to the RF power generator and the secondary winding coupled to both the susceptor electrode and the shower head electrode, the RF power splitter configured to provide power from the RF power generator to both the susceptor and the shower head electrode at a selected power ratio between the susceptor electrode and the shower head electrode, the selected power ratio being configured to supply a power component to the showerhead electrode that is a function of a ratio $A_1/A_2$ of the areas, wherein the selected power ratio is configured to apply RF power to the showerhead electrode proportional to $(A_1/A_2)^4$.

* * * * *